(12) United States Patent
Yan et al.

(10) Patent No.: US 11,387,115 B2
(45) Date of Patent: Jul. 12, 2022

(54) SILICON MANDREL ETCH AFTER NATIVE OXIDE PUNCH-THROUGH

(71) Applicants: Mattson Technology, Inc., Fremont, CA (US); Beijing E-Town Semiconductor Technology, Co., LTD, Beijing (CN)

(72) Inventors: Chun Yan, San Jose, CA (US); Tsai Wen Sung, Fremont, CA (US); Sio On Lo, Milpitas, CA (US); Hua Chung, Saratoga, CA (US); Michael X. Yang, Palo Alto, CA (US)

(73) Assignees: BEIJING E-TOWN SEMICONDUCTOR TECHNOLOGY, CO., LTD, Beijing (CN); MATTSON TECHNOLOGY, INC., Fremont, CA (US)

( * ) Notice: Subject to any disclaimer, the term of this patent is extended or adjusted under 35 U.S.C. 154(b) by 0 days.

(21) Appl. No.: 16/716,585

(22) Filed: Dec. 17, 2019

(65) Prior Publication Data

US 2020/0203182 A1 Jun. 25, 2020

Related U.S. Application Data

(60) Provisional application No. 62/790,661, filed on Jan. 10, 2019, provisional application No. 62/782,653, filed on Dec. 20, 2018.

(51) Int. Cl.
*H01L 21/3065* (2006.01)
*H01L 21/3213* (2006.01)
(Continued)

(52) U.S. Cl.
CPC ...... *H01L 21/32137* (2013.01); *H01J 37/321* (2013.01); *H01J 37/3244* (2013.01); *H01J 37/32091* (2013.01); *H01J 37/32422* (2013.01); *H01L 21/02071* (2013.01); *H01L 21/0332* (2013.01); *H01L 21/0335* (2013.01); *H01L 21/0337* (2013.01); *H01L 21/0338* (2013.01); *H01L 21/28088* (2013.01);
(Continued)

(58) Field of Classification Search
CPC ................. H01L 21/3065; H01L 21/30655
See application file for complete search history.

(56) References Cited

U.S. PATENT DOCUMENTS

| 8,808,563 B2 | 8/2014 | Wang et al. |
| 2001/0001743 A1 | 5/2001 | McReynolds |

(Continued)

OTHER PUBLICATIONS

PCT International Search Report and Written Opinion for corresponding PCT Application No. PCT/US2019/066725, dated Apr. 23, 2020, 12 pages.

*Primary Examiner* — Thomas T Pham
(74) *Attorney, Agent, or Firm* — Dority & Manning, P.A.

(57) ABSTRACT

Apparatus, systems, and methods for conducting a silicon containing material removal process on a workpiece are provided. In one example implementation, the method can include generating species from a process gas in a first chamber using an inductive coupling element. The method can include introducing a fluorine containing gas with the species to create a mixture. The mixture can include exposing a silicon structure of the workpiece to the mixture to remove at least a portion of the silicon structure.

10 Claims, 8 Drawing Sheets

(51) Int. Cl.
*H01L 21/02* (2006.01)
*H01L 21/033* (2006.01)
*H01L 29/66* (2006.01)
*H01L 21/67* (2006.01)
*H01J 37/32* (2006.01)
*H01L 21/28* (2006.01)

(52) U.S. Cl.
CPC .. *H01L 21/67069* (2013.01); *H01L 29/66545* (2013.01); *H01J 2237/334* (2013.01)

(56) References Cited

U.S. PATENT DOCUMENTS

| | | | |
|---|---|---|---|
| 2012/0091095 A1* | 4/2012 | Wang | H01J 37/32862 216/37 |
| 2012/0208371 A1* | 8/2012 | Rogers | C23C 16/4584 438/758 |
| 2013/0089988 A1* | 4/2013 | Wang | H01L 21/3081 438/719 |
| 2013/0193108 A1* | 8/2013 | Zheng | C23C 16/4404 216/59 |
| 2014/0248780 A1* | 9/2014 | Ingle | H01L 21/3065 438/745 |
| 2015/0079797 A1 | 3/2015 | Chen et al. | |
| 2015/0187939 A1* | 7/2015 | Wu | H01L 21/28114 257/412 |
| 2016/0064519 A1 | 3/2016 | Yang et al. | |
| 2016/0181112 A1* | 6/2016 | Xue | H01L 21/311 438/705 |
| 2016/0276134 A1 | 9/2016 | Collins et al. | |
| 2018/0358208 A1 | 12/2018 | Ma et al. | |
| 2020/0127013 A1* | 4/2020 | Pritchard | H01L 21/84 |

* cited by examiner

SILICON MANDREL ETCH AFTER NATIVE OXIDE PUNCH-THROUGH

PRIORITY CLAIM

The present application claims the benefit of priority of U.S. Provisional Application Ser. No. 62/782,653, titled "Silicon Mandrel Etch after Native Oxide Punch-Through," filed on Dec. 20, 2018, which is incorporated herein by reference. The present application claims the benefit of priority of U.S. Provisional Application Ser. No. 62/790,661, titled "Silicon Mandrel Etch after Native Oxide Punch-Through," filed on Jan. 10, 2019, which is incorporated herein by reference.

FIELD

The present disclosure relates generally to surface treatment of a workpiece, such as semiconductor workpiece.

BACKGROUND

The processing of semiconductor workpieces can involve the deposition and removal of different materials layers on a substrate. Device dimension and materials thickness continue to decrease in semiconductor processing with shrinking critical dimensions in semiconductor devices. In advanced device nodes, material removal with high selectivity to other material can become increasingly important to semiconductor device performance. For instance, in some structures, silicon mandrel and silicon replacement gate removal can be of particular importance as such removal can damage spacers and/or leave residue on sub layers.

SUMMARY

Aspects and advantages of embodiments of the present disclosure will be set forth in part in the following description, or may be learned from the description, or may be learned through practice of the embodiments.

One example aspect of the present disclosure is directed to a method for removing a silicon structure disposed on a workpiece. The method can include generating species from a process gas in a first chamber using an inductive coupling element. The method can include introducing a fluorine containing gas with the species to create a mixture. The mixture can include exposing the silicon structure of the workpiece to the mixture to remove at least a portion of the silicon structure.

Other example aspects of the present disclosure are directed to systems, methods, and apparatus for seasoning a chamber for hydrogen radical treatment of workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
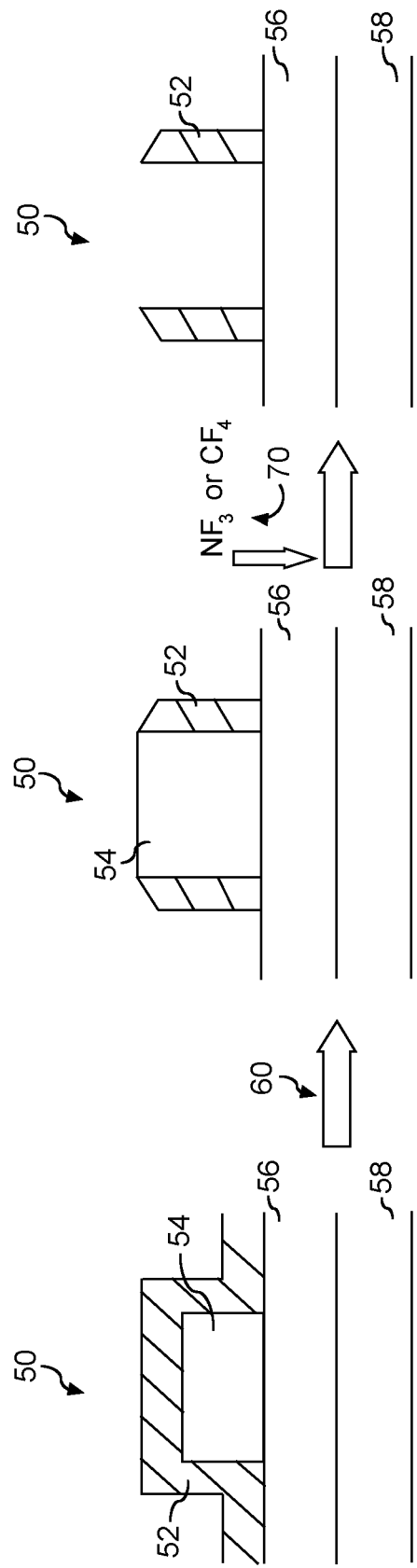
FIG. 1 depicts an example silicon mandrel removal process on a structure according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to processes for removing a silicon mandrel disposed on a workpiece. Device dimension and thickness of materials continue to decrease with shrinking critical dimension in semiconductor devices. In fabrication of advanced logic and memory (e.g. dynamic random-access memory DRAM) devices, a so-called self-aligned double patterning (SADP) technology can be an economic approach to significantly reduce feature size with conventional lithography tool resolution. In an example SADP process flow, a spacer (e.g., SiN) pair structure is first formed with mandrel (e.g. silicon) material in between. Subsequently, the mandrel material is selectively removed with the spacer structure remaining intact. The spacer structure further serves as a hardmask in a following anisotropic ion etch process to transfer its pattern to underlying materials. In another example of process flow, the self-aligned double patterning (SADP) scheme can be repeated in a so called self-aligned quadruple patterning (SAQP) scheme.

In an example SADP/SAQP scheme, a silicon (Si) mandrel is about 10-50 nm in size with a height to width ratio (i.e. aspect ratio) of 4-8:1. The silicon feature size and selectivity removal requirement is similar between silicon mandrel in SADP/SAQP process and silicon replacement gate used in advanced field-effect transistor (FET) device fabrication.

It can be important for a semiconductor manufacturing system and related processes to remove silicon mandrel and/or silicon replacement gate with high selectivity to spacer material and other materials (e.g., oxide, TiN). Conventional methods can remove silicon mandrel and/or silicon replacement gate with chlorine ($Cl_2$), hydrogen bromide (HBr) or the likes inside a plasma chamber. These conventional methods can have some drawbacks. There is a concern of materials corrosion with chlorine ($Cl_2$) and hydrogen bromide (HBr) gases. Additionally, such methods can result in either a lower selectivity or a silicon residue. A wet process may need be followed to clean up the silicon residue or to improve the sub layer damage.

According to examples aspects of the present disclosure, an inductively coupled plasma source (ICP) with very high selectivity can be used to remove silicon mandrel. More particularly, according to examples aspects of the present disclosure, a fluorine containing gas (e.g., nitrogen trifluoride ($NF_3$) or tetrafluoromethane ($CF_4$) or other fluorine containing hydrocarbons such as $CH_2F_2$ (difluoromethane), $CHF_3$ (fluoroform), $CH_3F$ (fluoromethane) can be used to create highly selective species associated with a remote ICP plasma source for removal of a silicon mandrel with reduced damage to spacers and sublayers.

For instance, one example aspect of the present disclosure is directed to a method for removing a silicon structure disposed on workpiece. The method can include generating species from a process gas using an inductive coupling element in a first chamber (e.g., a plasma chamber). The method can include introducing a fluorine containing gas (e.g., nitrogen trifluoride ($NF_3$) or tetrafluoromethane ($CF_4$) or other fluorine containing hydrocarbons such as $CH_2F_2$, $CHF_3$, $CH_3F$) or other fluorine containing hydrocarbons such as $CH_2F_2$ (difluoromethane), $CHF_3$ (fluoroform), $CH_3F$ (fluoromethane) with the species to create a mixture. The method can include exposing the silicon structure of the workpiece to the mixture to remove at least a portion of the silicon structure. Examples of the silicon structure can include silicon mandrel, silicon replacement gate, or any other suitable silicon containing material. In some embodiments, the process gas can further include hydrogen ($H_2$). In some other embodiments, the process gas can also include an inert gas, such as helium (He), or argon (Ar).

In some embodiments, the fluorine containing gas (e.g., nitrogen trifluoride ($NF_3$) or tetrafluoromethane ($CF_4$) or other fluorine containing hydrocarbons such as $CH_2F_2$, $CHF_3$, $CH_3F$) can be introduced as part of the process gas. The process gas can be admitted into a plasma chamber and a plasma can be induced using the inductively coupled plasma source to generate a mixture. The silicon structure (e.g., silicon mandrel or silicon replacement gate) on the workpiece can be exposed to the mixture (e.g., after filtering through a separation grid) to be selectively removed.

In some embodiments, the process gas can include inert gas. The inert gas can be admitted into the plasma chamber. The fluorine containing gas (e.g., $NF_3$ or $CF_4$ or other fluorine containing hydrocarbons such as $CH_2F_2$, $CHF_3$, $CH_3F$) can be injected outside of the plasma chamber and at downstream flow location from the plasma chamber. For instance, the fluorine containing gas (e.g., $NF_3$ or $CF_4$ or other fluorine containing hydrocarbons such as $CH_2F_2$, $CHF_3$, $CH_3F$) can be injected via a post-plasma gas injection gas source. As an example, the post-plasma gas injection gas source can be located between a first grid plate and a second grid plate of a separation grid that can separate the plasma chamber from a processing chamber. In some embodiments, the post plasma gas injection gas source can be located beneath the separation grid in the processing chamber.

In some instances, it can be desirable to remove a native oxide on the silicon mandrels or silicon replacement gates (e.g., native oxide punch-through process) prior to removing the silicon mandrels or silicon replacement gates. According to example aspects of the present disclosure, the method can further include generating a capacitively coupled plasma using a plasma source. The method can include exposing the silicon mandrel or silicon replacement gate structures on the workpiece to the capacitively coupled plasma to remove at least a portion of a native oxide layer on top of the silicon mandrels or silicon replacement gates.

In some embodiments, the capacitively coupled plasma can be generated in a processing chamber of a separate plasma processing apparatus relative to the inductively coupled plasma source used to perform the silicon mandrel or silicon replacement grate removal process. For instance, the native oxide punch-through process and the silicon mandrel or silicon replacement gate removal process can be performed in a processing platform with vacuum transfer (or near vacuum transfer) between processing chambers of separate processing apparatuses. The workpiece can be placed into a first processing chamber of a first plasma processing apparatus to perform a native oxide punch-through process using a capacitively coupled plasma source. The workpiece can be transferred to a second processing chamber of a second plasma processing apparatus using a workpiece handling robot in a transfer chamber. The second plasma processing apparatus can generate an inductively coupled plasma to remove the silicon mandrels or silicon replacement gates according to example aspects of the present disclosure after the native oxide punch-through process.

In some embodiments, the capacitively coupled plasma can be generated in a processing chamber using the same plasma processing apparatus as the plasma processing apparatus used to perform a silicon mandrel or silicon replacement gate removal. For instance, a workpiece can include a silicon mandrel or silicon replacement gate at least partially covered by a native oxide layer. The workpiece can be placed into a processing chamber for silicon mandrel or silicon replacement gate removal process. Prior to silicon mandrel or silicon replacement gate removal process, a native oxide punch-through process can be performed by a capacitively coupled plasma induced in the processing chamber to remove the native oxide layer on top of the silicon mandrel or silicon replacement gate. After the native oxide punch-through process, an indirect or remote inductively coupled plasma can be used for silicon mandrel or silicon replacement gate removal process.

Example aspects of the present disclosure provide a number of technical effects and benefits. For instance, an inductively coupled plasma source (ICP) with very high selectivity can be used to etch silicon mandrels or silicon replacement gates, and a capacitively coupled plasma source (CCP) can be used to etch through a thin layer of native oxide on top of silicon mandrels or silicon replacement gates. As such, silicon mandrels or silicon replacement gates can be removed completely with reduced damages on spacer (e.g., SiN spacers) and sublayer (e.g., oxide sublayers, TiN sublayers) materials.

Example process parameters for removing a silicon mandrel or silicon replacement gate using an inductively coupled plasma source according to example embodiments of the present disclosure are provided below:

Example 1

Process Gas: $CF_4$, $NF_3$, $H_2$
Dilution Gas: He/Ar

Process Pressure: about 200 mTorr to about 1000 mTorr (e.g., about 600 mTorr)

Inductively Coupled Plasma Source Power: about 600 W to about 2500 W (e.g., about 1500 W)

Capacitively Coupled Plasma Source Power: about 0 W to about 150 W (e.g., about 50 W)

Workpiece Temperature: (20° C.) about 5° C. to 90° C. (e.g., about 20° C.)

Process Period: about 10 seconds to 200 seconds (e.g., 40 seconds)

Gas Flow Rates for Process Gas: about 50 sccm to about 500 sccm (e.g., 310 sccm)

Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (20%) of the stated numerical value. A "pedestal" refers to any structure that can be used to support a workpiece.

FIG. 1 depicts an example silicon mandrel removal process on a structure 50 according to example embodiments of the present disclosure. The structure 50 includes a spacer layer 52 (e.g., SiN spacer layer), a silicon mandrel 54, a sublayer 56 (e.g., an oxide layer), and a substrate 58 (e.g., a silicon substrate). In some embodiments (not shown in FIG. 1), the structure 50 can include a plurality of sublayers (e.g., silicon nitride layers, oxide layers, etc.) disposed on the substrate 58.

A spacer open process 60 according to example aspects of the present disclosure can be conducted on the structure 50 to remove one or more portions of the spacer layer 52 that covers the silicon mandrel 54 such that the silicon mandrel 54 can be exposed. Subsequent to removing the spacer layer 52 on top of the silicon mandrel 54, a silicon mandrel removal process 70 can be conducted on the structure 50 to remove the silicon mandrel 54. In some embodiments, the silicon mandrel removal process 70 exposes the silicon mandrel 54 to an inductively coupled plasma induced in a process gas (e.g., $H_2/He/NF_3$, $H_2/Ar/NF_3$, $H_2/He/CF_4$, or $H_2/Ar/CF_4$).

In some embodiments, the spacer open process 60 and the silicon mandrel removal process 70 can be performed in the same processing apparatus. As one example, the inductively coupled plasma induced in a plasma chamber can be used to remove the spacer layer 52 first, and then to remove exposed silicon mandrel 54. Subsequent to removing the spacer layer 52 on top of the silicon mandrel 54, the inductively coupled plasma induced in a plasma chamber can be used to remove silicon mandrel 54.

In some embodiments, the spacer open process 60 and the silicon mandrel removal process 70 can be performed in separate plasma processing apparatuses. For instance, the spacer open process 60 and the silicon mandrel removal process 70 can be performed in one processing platform with vacuum transfer (or near vacuum transfer) between processing chambers of separate plasma processing apparatuses. The structure 50 can be transferred to a first processing chamber of a first plasma processing apparatus using a workpiece handling robot in a transfer chamber. The spacer layer 52 can be removed using an inductively coupled plasma or a capacitively coupled plasma of the first plasma processing apparatus. The structure 50 can be transferred to a second processing chamber of a second processing apparatus using a workpiece handling robot in a transfer chamber. The silicon mandrel 54 can be removed using an inductively coupled plasma of the second plasma processing apparatus in a process gas (e.g., $H_2/He/NF_3$, $H_2/Ar/NF_3$, $H_2/He/CF_4$, or $H_2/Ar/CF_4$).

Figure 2:
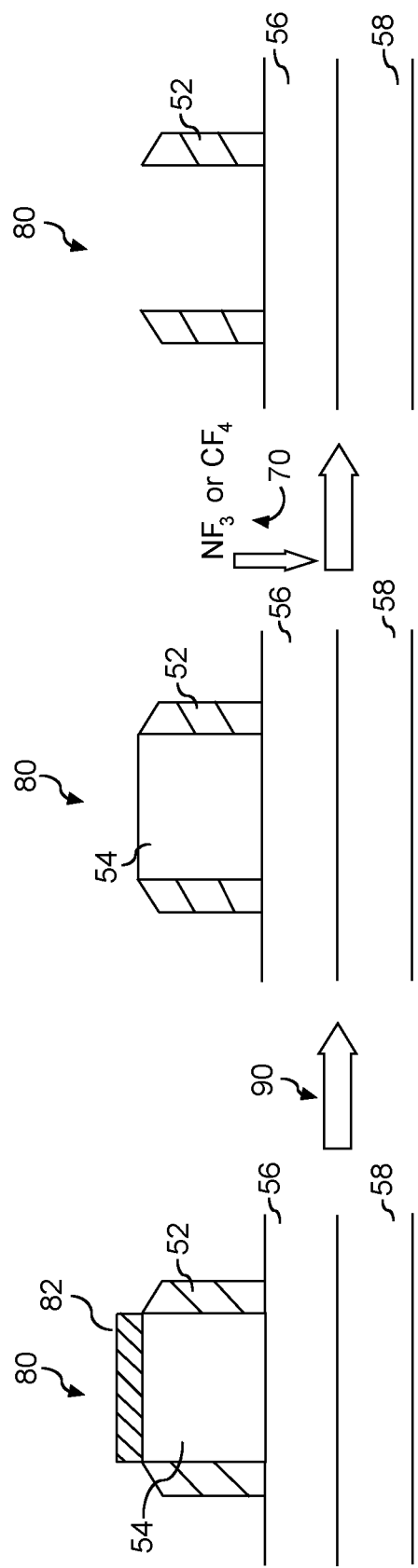
FIG. 2 depicts an example silicon mandrel removal process on a structure according to example embodiments of the present disclosure.

FIG. 2 depicts an example silicon mandrel removal process on a structure 80 according to example embodiments of the present disclosure. The structure 80 includes a native oxide layer 82, a spacer layer 52, a silicon mandrel 54, a sublayer 56 (e.g., an oxide layer), and a substrate 58 (e.g., a silicon substrate). In some embodiments (not shown in FIG. 2), the structure 80 can include a plurality of sublayers (e.g., silicon nitride layers, oxide layers, etc.) disposed on the substrate 58. The native oxide layer 82 can form on the silicon mandrel 54 as a result of exposure of the silicon mandrel 54 to an oxygen containing environment.

A native oxide punch-through process 90 can be implemented using a capacitively coupled plasma source to remove the native oxide layer 82. The native oxide punch-through process 90 exposes the native oxide layer 82 to a plasma generated using a capacitively coupled plasma source to remove at least a portion of the native oxide layer 82 on top of the silicon mandrel layer 54. Subsequent to removing the native oxide layer 82, a silicon mandrel removal process 70 can be implemented according to example aspects of the present disclosure to expose the silicon mandrel 54 to species generated in an inductively coupled plasma to remove the silicon mandrel 54.

In some embodiments, the native oxide punch-through process 90 and the silicon mandrel removal process 70 can be performed in the same processing apparatus. For instance, a capacitively coupled plasma using a capacitive coupling element in a processing chamber of the same processing apparatus can be used to remove the native oxide layer 82. Subsequent to removing the native oxide layer 82 on top of the silicon mandrel 54, the inductively coupled plasma induced in a plasma chamber can be used to remove silicon mandrel 54.

In some embodiments, the native oxide punch-through process 90 and the silicon mandrel removal process 70 can be performed in separate plasma processing apparatuses. For instance, the native oxide punch-through process 90 and the silicon mandrel removal process 70 can be performed in one processing platform with vacuum transfer (or near vacuum transfer) between processing chambers of separate plasma processing apparatuses. The structure 80 can be transferred to a first processing chamber of a first plasma processing apparatus using a workpiece handling robot in a transfer chamber. The native oxide layer 82 can be removed using a capacitively coupled plasma of the first plasma processing apparatus. The structure 80 can be transferred to a second processing chamber of a second processing apparatus using a workpiece handling robot in a transfer chamber. The silicon mandrel 54 can be removed using an inductively coupled plasma of the second plasma processing apparatus in a process gas (e.g., $H_2/He/NF_3$, $H_2/Ar/NF_3$, $H_2/He/CF_4$, or $H_2/Ar/CF_4$).

Figure 3:
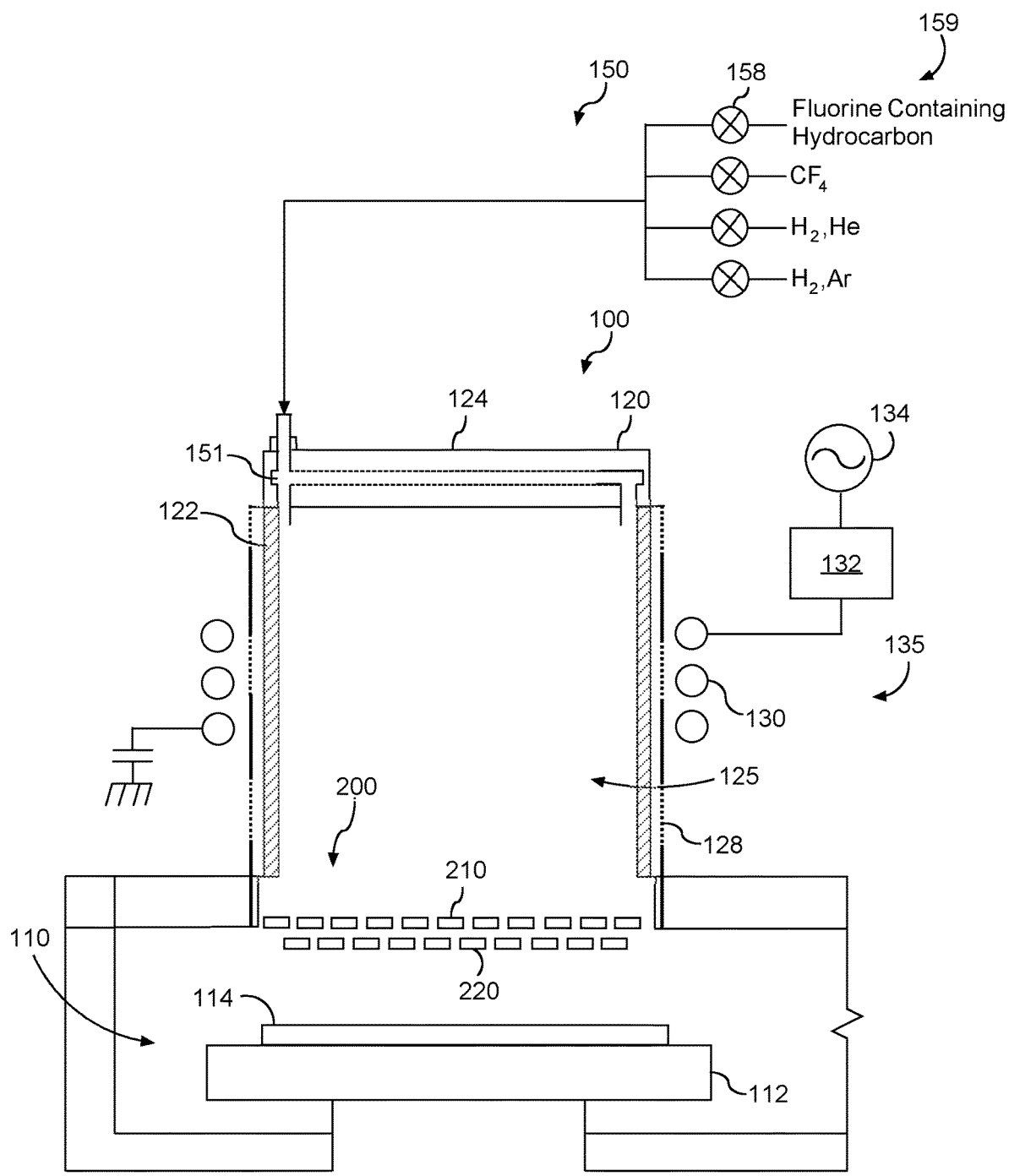
FIG. 3 depicts an example plasma processing apparatus according to example embodiments of the present disclosure.

FIG. 3 depicts an example plasma processing apparatus 100 according to example embodiments of the present disclosure. As illustrated, the plasma processing apparatus 100 includes a processing chamber 110 and a plasma chamber 120 that is separated from the processing chamber 110. The processing chamber 110 includes a workpiece support or pedestal 112 operable to hold a workpiece 114 to be processed, such as a semiconductor wafer. In this example illustration, a plasma is generated in the plasma chamber 120 (i.e., plasma generation region) by an inductively coupled plasma source 135 and desired species are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. The dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., a hydrogen gas and a carrier gas) can be provided to the chamber interior from a gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 3, a separation grid 200 separates the plasma chamber 120 from the processing chamber 110. The separation grid 200 can be used to perform ion filtering from a mixture generated by plasma in the plasma chamber 120 to generate a filtered mixture. Neutral radicals generated by the plasma can pass through the separation grid for exposure to the workpiece. The filtered mixture can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with one grid plate.

As shown in FIG. 3, according to example aspects of the present disclosure, the apparatus 100 can include a gas delivery system 150 configured to deliver process gas to the plasma chamber 120, for instance, via gas distribution channel 151 or other distribution system (e.g., showerhead). The gas delivery system can include a plurality of feed gas lines 159 as gas sources. The feed gas lines 159 can be controlled using valves and/or mass flow controllers to deliver a desired amount of gases into the plasma chamber as process gas. As shown in FIG. 3, the gas delivery system 150 can include feed gas line(s) for delivery of a $NF_3$ gas from a $NF_3$, feed gas line(s) for delivery of a $CF_4$ gas, feed gas line(s) for delivery of other fluorine containing hydrocarbons such as $CH_2F_2$, $CHF_3$, $CH_3F$, feed gas line(s) for delivery of a first hydrogen containing gas (e.g., $H_2$/He, or hydrogen gas mixed with other inert gas), and/or feed gas line(s) for delivery of a second hydrogen containing gas (e.g., $H_2$/Ar, hydrogen gas mixed with other inert gas). A control valve and/or mass flow controller 158 can be used to control a flow rate of each feed gas line to flow a process gas (e.g., $H_2$/He/$NF_3$, $H_2$/Ar/$NF_3$, $H_2$/He/$CF_4$, or $H_2$/Ar/$CF_4$) into the plasma chamber 120.

Figure 4:
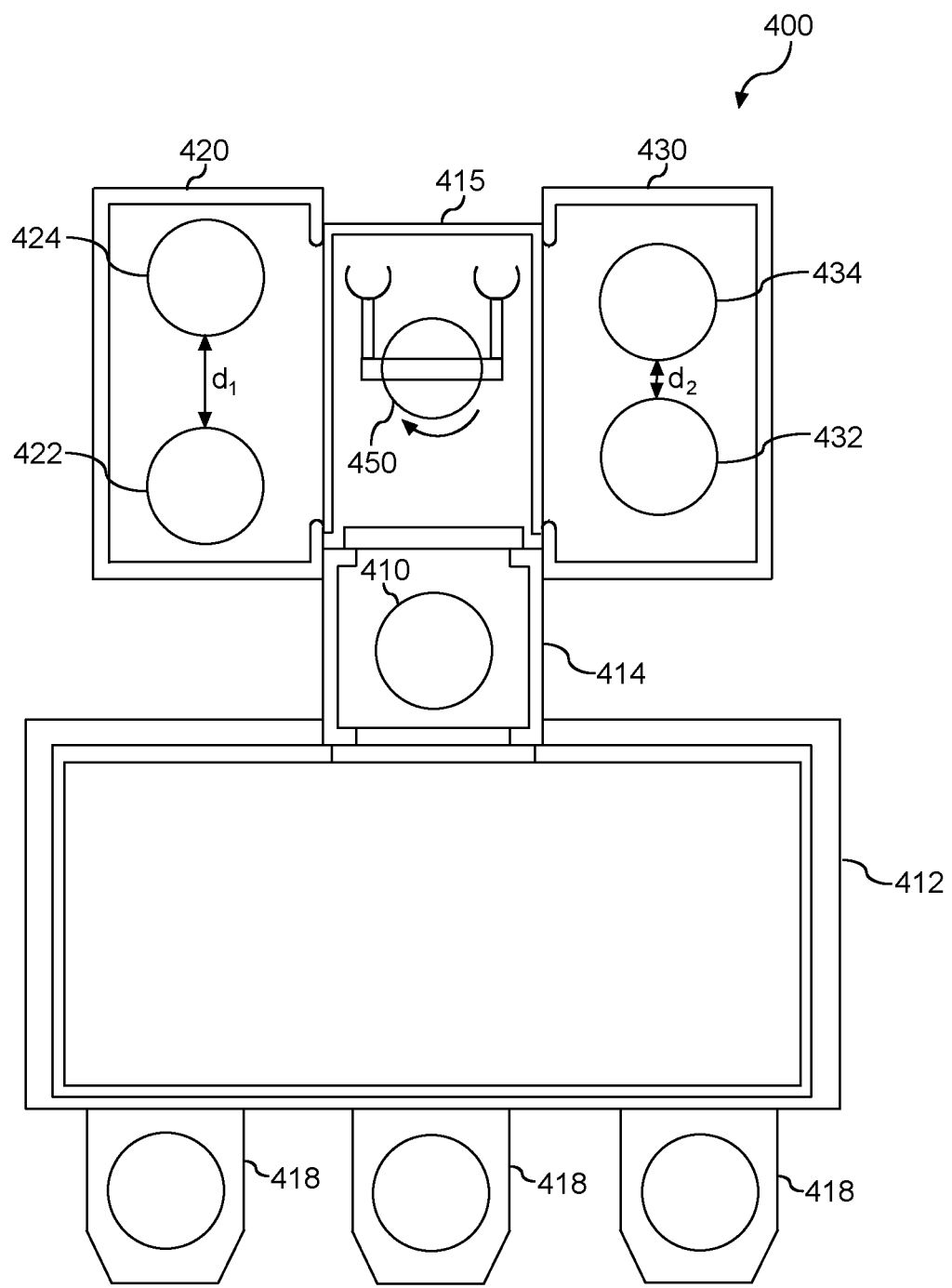
FIG. 4 depicts an example processing platform according to example embodiments of the present disclosure.

FIG. 4 depicts an example processing platform 400 according to example embodiments of the present disclosure. The processing platform 400 can include a front-end portion 412, a load lock chamber 414, a transfer chamber 415 and a plurality of processing chambers, including a first processing chamber 420 and a second processing chamber 430. In some embodiments, the processing platform 400 can include more than two processing chambers.

The front-end portion 412 can be configured to be maintained, for instance, at atmospheric pressure and can be configured to engage workpiece input devices 418. The workpiece input devices 418 can include, for instance, cassettes, front opening unified pods, or other devices for supporting a plurality of workpieces. Workpiece input devices 418 can be used to provide pre-process workpieces to the processing platform 400 or to receive post-process workpieces from the processing platform 400.

The front-end portion 412 can include one or more workpiece handling robots (not illustrated) for transferring workpieces from workpiece input devices 418 to, for instance, the load lock chamber 414, such as to and from a workpiece column 410 located in the load lock chamber 414. In one example, the workpiece handling robot in the front-end portion 412 can transfer preprocess workpieces to the load lock chamber 414 and can transfer post-process workpieces from the load lock chamber 414 to one or more of the workpiece input devices 418. Any suitable robot for transferring workpieces can be used in the front-end portion 412 without deviating from the scope of the present disclosure. Workpieces can be transferred to and or from the load lock chamber 414 through a suitable slit, opening, or aperture.

The load lock chamber 414 can include a transfer position having a workpiece column 410 configured to support a plurality of workpieces in a stacked arrangement. The workpiece column 410 can include, for instance, a plurality of shelves. Each shelf can be configured to support one or more workpieces. In one example implementation, the workpiece column 410 can include one or more shelves for supporting preprocess workpieces and one or more shelves for supporting post-process workpieces.

The load lock chamber 414 can be used to adjust the pressure surrounding the workpieces from the pressure associated with the front-end portion 412 to a process pressure, such as a vacuum or near vacuum pressure or other process pressure, prior to transfer of the workpieces to processing chambers, such as first processing chamber 420 and/or second processing chamber 430. In some embodiments, appropriate valves can be provided in conjunction with the load lock chamber 414 and other chambers to appropriately adjust the process pressure for processing the workpieces.

According to example aspects of the present disclosure, the first processing chamber 420 can include one or more capacitively coupled plasma sources to implement a native-oxide punch through process. The second processing chamber 430 can include plasma source(s) similar to that of FIG. 3 to implement a silicon mandrel removal process according to example embodiments of the present disclosure.

As illustrated, each of the first processing chamber 420 and second processing chamber 430 can be dual workpiece processing chambers. The first processing chamber 420 and the second processing chamber 430 each can include a pair of processing stations in side-by-side arrangement so that a pair of workpieces can be simultaneously exposed to the same process. The first processing chamber 420 and or the second processing chamber 430 can include a single processing station without deviating from the scope of the present disclosure.

Each processing station can include a workpiece support (e.g., a pedestal) for supporting a workpiece during processing. In some embodiments, each processing station can share a common pedestal with two portions for supporting a workpiece. The first processing chamber 420 and/or the second processing chamber 430 can be selectively sealed off from the transfer chamber 415 for processing.

The transfer chamber 415 can include a workpiece handling robot 450. The workpiece handling robot 450 can be configured to transfer workpieces from the workpiece column 410 in the load lock chamber 414 to the processing stations in the first processing chamber 420 and/or the second processing chamber 430. The workpiece handling robot 450 can also transfer workpieces between the first processing chamber 420 and the second processing chamber 430. For example, the workpiece handling robot 450 can transfer the workpieces from the workpiece column 410 in the load lock chamber 414 to the two side-by-side processing stations 422 and 424 in the first processing chamber 420. Similarly, the workpiece handling robot 450 can transfer workpieces from the workpiece column 410 in the load lock chamber 414 to the two side-by-side processing stations 432 and 434 in the second processing chamber 430.

Figure 5:
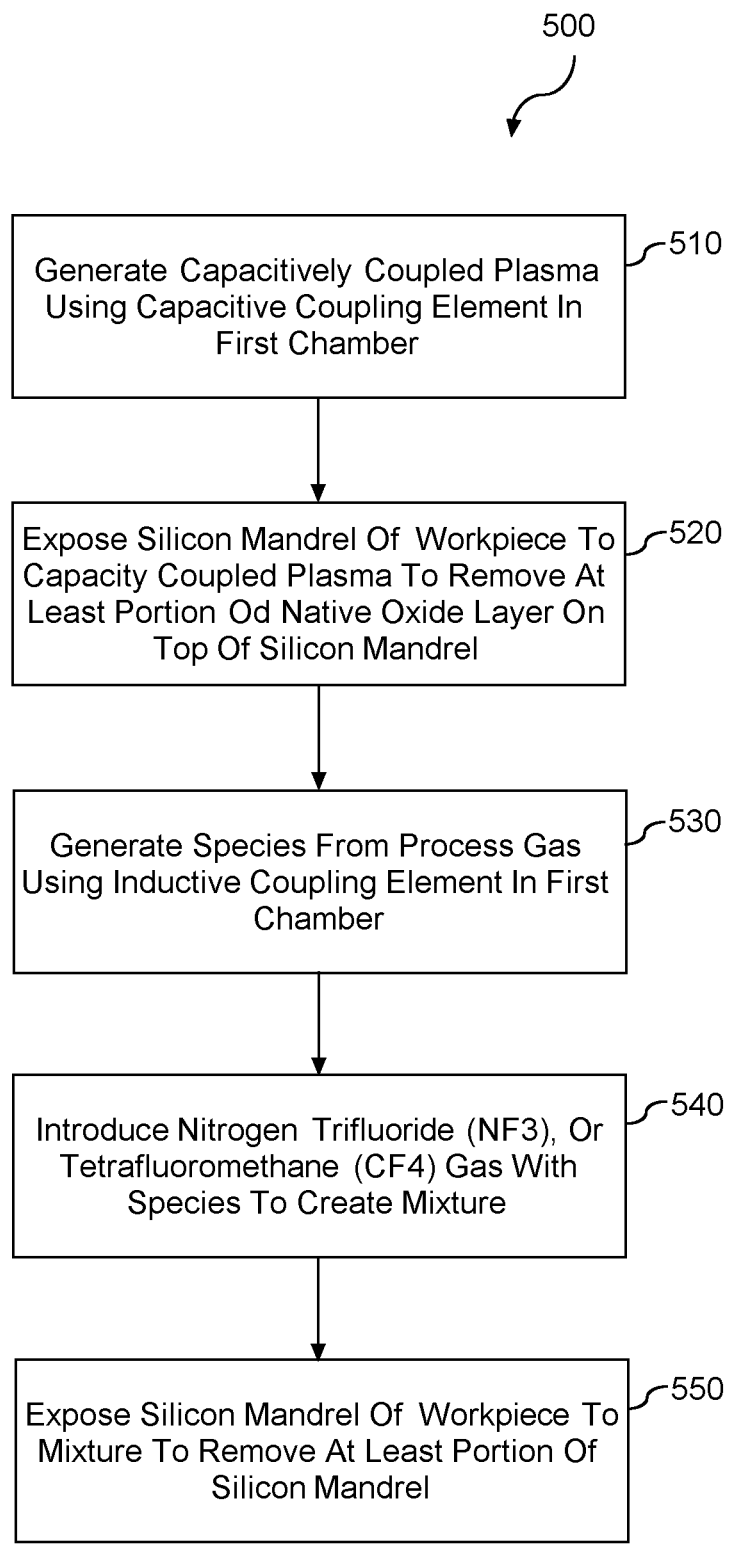
FIG. 5 depicts a flow diagram of an example process according to example embodiments of the present disclosure.

FIG. 5 depicts a flow diagram of an example method (500) according to example embodiments of the present disclosure. The method (500) will be discussed with reference to the plasma processing apparatus 100 of FIG. 3, and the processing platform 400 of FIG. 4 by way of example. The method (500) can be implemented in any suitable plasma processing apparatus. FIG. 5 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (510), the method can include generating a capacitively coupled plasma using a capacitive coupling element in a first chamber. At (520), the method can include exposing silicon mandrels or silicon replacement gates on workpiece to capacitively coupled plasma to remove at least a portion of a native oxide layer on top of silicon mandrel or silicon replacement gate.

For instance, this native oxide punch-through process can be performed in a processing platform 400 with vacuum transfer (or near vacuum transfer) between processing chambers 420 and 430. The workpiece can be placed into a first processing chamber 420 of a first plasma processing apparatus (e.g., a first plasma processing apparatus 100) to perform native oxide punch-through process using a capacitively coupled plasma. The workpiece can be transferred to a second processing chamber 430 of a second plasma processing apparatus (e.g., a second plasma processing apparatus 100) using a workpiece handling robot 450 in a transfer chamber 415. The second plasma processing apparatus can generate an inductively coupled plasma to remove the silicon mandrels or silicon replacement gates after the native oxide punch-through process, as further described with respect to (530), (540), and (550).

At (530), the method can include generating species from a process gas using an inductive coupling element in a second chamber. For instance, a gas delivery system 150 of a second plasma processing apparatus 100 can use the feed gas lines 159 to deliver process gas (e.g., $H_2$/He, $H_2$/Ar), or inert gas with no hydrogen gas into the plasma chamber 120 to generate species.

At (540), the method can include introducing nitrogen trifluoride ($NF_3$) or tetrafluoromethane ($CF_4$) or other fluorine containing hydrocarbons such as $CH_2F_2$, $CHF_3$, $CH_3F$ with the species to create a mixture. In some embodiments, nitrogen trifluoride ($NF_3$) or tetrafluoromethane ($CF_4$) or other fluorine containing hydrocarbons such as $CH_2F_2$, $CHF_3$, $CH_3F$ can be introduced with the species as part of the process gas. For instance, the gas delivery system 150 can use the feed gas lines 159 to deliver process gas (e.g., $H_2$/He/$NF_3$, $H_2$/Ar/$NF_3$, $H_2$/He/$CF_4$, or $H_2$/Ar/$CF_4$) into the plasma chamber 120 to create a mixture (e.g., radicals). In some embodiments, nitrogen trifluoride ($NF_3$) or tetrafluoromethane ($CF_4$) or other fluorine containing hydrocarbons such as $CH_2F_2$, $CHF_3$, $CH_3F$ can be introduced via a post-plasma gas injection, as further described in FIG. 7.

At (550), the method can include exposing the silicon mandrels or silicon replacement gates on the workpiece to the mixture (e.g., after filtering through a separation grid) to remove at least one portion of the silicon mandrels or silicon replacement gates. For instance, the workpiece 114 can be exposed to the species generated in the inductively coupled plasma (e.g., neutral species passing through the separation grid) to remove the silicon mandrels or silicon replacement gates.

Figure 6:
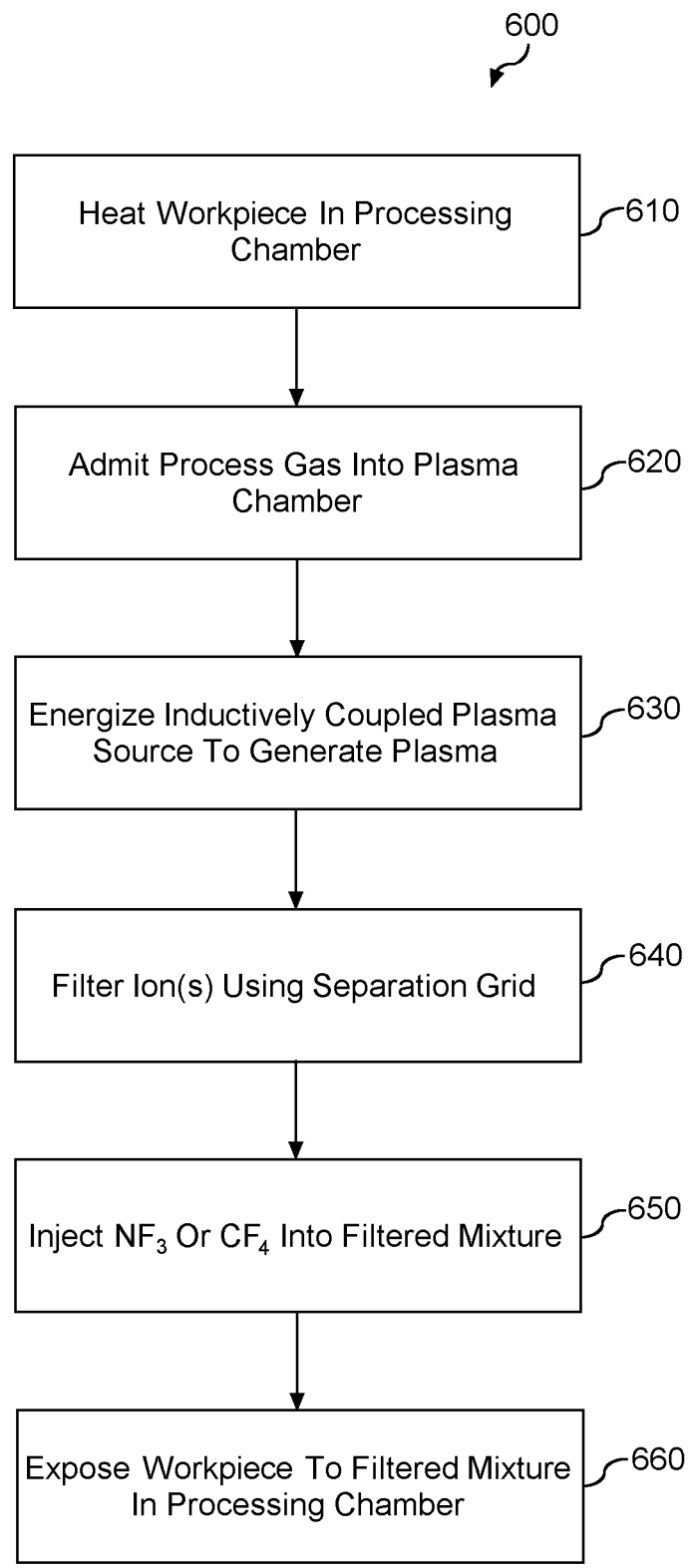
FIG. 6 depicts a flow diagram of an example process according to example embodiments of the present disclosure.

FIG. 6 depicts a flow diagram of an example process (600) according to example embodiments of the present disclosure. The method (600) will be discussed with reference to the plasma processing apparatus 100 of FIG. 3 and the processing platform 400 of FIG. 4 by way of example. The method (600) can be implemented in any suitable plasma processing apparatus. FIG. 6 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (610), the method can include heating the workpiece in a processing chamber. For instance, the workpiece 114 can be heated in the processing chamber 110 to a process temperature. The workpiece 114 can be heated, for instance, using one or more heating systems associated with the pedestal 112. In some embodiments, the workpiece can be heated to a process temperature in the range of about 90° C. to about 400° C.

At (620), the method can include admitting a process gas into the plasma chamber. For instance, a process gas can be admitted into the plasma chamber interior 125 from a gas source 150 via annular gas distribution channel 151 or other suitable gas introduction mechanism. In some embodiments, the process gas can be an inert gas, such as helium, argon, etc. Other process gases can be used without deviating from the scope of the present disclosure. For instance, the process gas can include a mixture of an inert gas and hydrogen gas.

At (630), the method can include energizing an inductively coupled plasma source to generate a plasma in a plasma chamber. For instance, induction coil 130 can be energized with RF energy from RF power generator 134 to generate a plasma in the plasma chamber interior 125.

At (640), the method can include filtering one or more ions generated by the plasma using a separation grid to create a filtered mixture. The filtered mixture can include neutral species (e.g., excited inert gas molecules). In some embodiments, the one or more ions can be filtered using a separation grid assembly separating the plasma chamber from a processing chamber where the workpiece is located. For instance, the separation grid assembly 200 can be used to filter ions generated by the plasma. The separation grid 200 can have a plurality of holes. Charged particles (e.g., ions) can recombine on the walls in their path through the plurality of holes. Neutral species (e.g. radicals) can pass through the holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid 200 can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid 200 can have a first grid plate 210 and a second grid plate 220 in parallel relationship with one another. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

At (650), the method can include injecting $NF_3$ or $CF_4$ or other fluorine containing hydrocarbons such as $CH_2F_2$, $CHF_3$, $CH_3F$ into the filtered mixture to generate highly selective radicals for removal of silicon mandrels or silicon replacement gates. For instance, the $NF_3$ or $CF_4$ or other fluorine containing hydrocarbons such as $CH_2F_2$, $CHF_3$, $CH_3F$ can be injected via a post-plasma gas injection system that can be located between the first grid plate 210 and the second grid plate 220 of the separation grid 200. The $NF_3$ or $CF_4$ or other fluorine containing hydrocarbons such as $CH_2F_2$, $CHF_3$, $CH_3F$ can be injected via a post-plasma gas injection system at a location beneath the separation grid. Example post plasma gas injection is illustrated in FIG. 7.

At (660), the method can include exposing the workpiece to the filtered mixture in the processing chamber. More particularly, the workpiece 114 can be exposed to radicals generated in the plasma and passing through the separation grid assembly 200. For instance, the workpiece 114 can be exposed to radicals generated using post plasma gas injection to remove the silicon mandrels or silicon replacement gates.

According to example aspects of the present disclosure, the method can further include a native oxide punch through process for removal of a native oxide layer on the silicon mandrels or silicon replacement gates. The native oxide punch through process can include generating a capacitively coupled plasma using a capacitive coupling element in a second chamber from the process gas, and exposing the silicon mandrels or silicon replacement gates on the workpiece to the capacitively coupled plasma to remove at least a portion of a native oxide layer on top of the silicon mandrels or silicon replacement gates.

Figure 7:
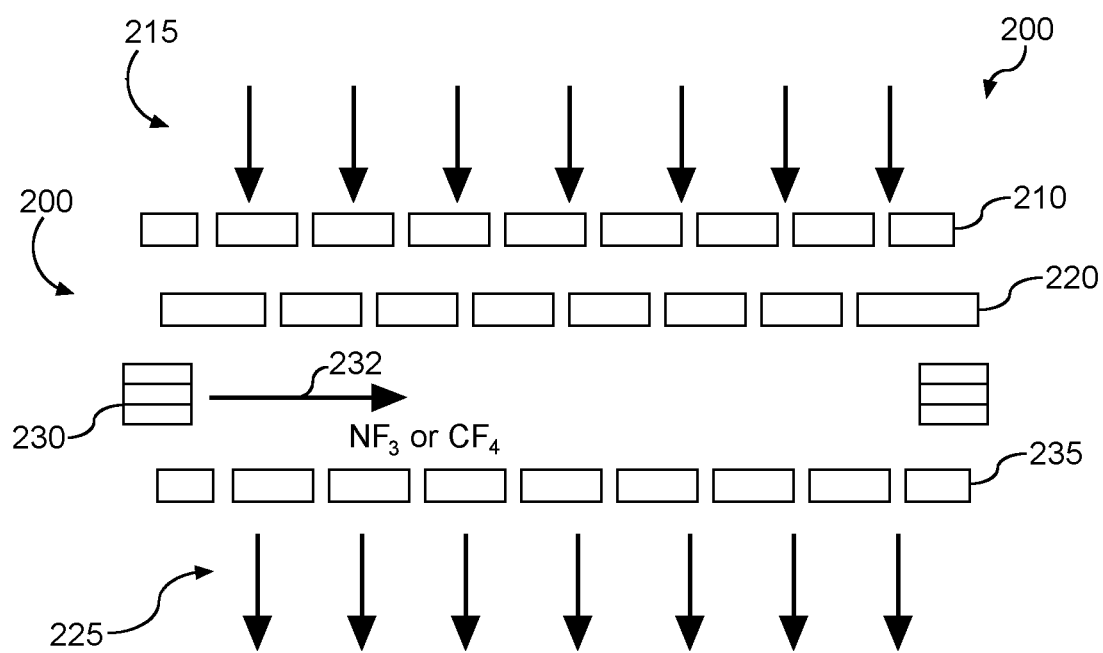
FIG. 7 depicts example injection of a fluorine containing gas using post-plasma injection according to example embodiments of the present disclosure.

FIG. 7 depicts example injection of a fluorine containing gas using post-plasma gas injection according to example embodiments of the present disclosure. The separation grid 200 includes a first grid plate 210 and a second grid plate 220 disposed in parallel relationship. The first grid plate 210 and the second grid plate 220 can provide for ion/UV filtering.

The first grid plate 210 can have a first grid pattern having a plurality of holes. The second grid plate 220 can have a second grid pattern having a plurality of holes. The first grid pattern can be the same as or different from the second grid pattern. Species 215 from the plasma can be exposed to the separation grid 200. Charged particles (e.g., ions) can recombine on the walls in their path through the holes of each grid plate 210, 220 in the separation grid 200. Neutral species can flow relatively freely through the holes in the first grid plate 210 and the second grid plate 220.

Subsequent to the second grid plate 220, a gas injection source 230 can be configured to introduce $NF_3$ gas or $CH_4$ gas or other fluorine containing hydrocarbons such as $CH_2F_2$, $CHF_3$, $CH_3F$ into the species passing through the separation grid 200. A mixture 225 can pass through a third grid plate 235 for exposure to the workpiece in the processing chamber.

The present example is discussed with reference to a separation grid with three grid plates for example purposes. Those of ordinary skill in the art, using the disclosures provided herein, will understand that more or fewer grid plates can be used without deviating from the scope of the present disclosure. In addition, the $NF_3$ gas or $CH_4$ gas or other fluorine containing hydrocarbons such as $CH_2F_2$, $CHF_3$, $CH_3F$ can be mixed with the species at any point in the separation grid and/or after the separation grid in the processing chamber. For instance, the gas source 230 can be located between first grid plate 210 and second grid plate 220.

The plasma etch processes (e.g., native oxide punch-through process, silicon mandrel or silicon replacement gate removal process, and spacer open process) according to example aspects of the present disclosure can be implemented using other plasma processing apparatus without deviating from the scope of the present disclosure.

The silicon mandrel or silicon replacement gate removal process and native oxide punch through process according to example aspects of the present disclosure can be implemented in the same plasma processing apparatus. In some embodiments, capacitively coupled plasma can be generated in a processing chamber using the same plasma processing apparatus as the plasma processing apparatus used to perform a silicon mandrel or a silicon replacement gate etch. For instance, a workpiece can include a silicon mandrel or a silicon replacement gate at least partially covered by a native oxide layer. The workpiece can be placed into a processing chamber for silicon mandrel or silicon replacement gate removal process. Prior to silicon mandrel or silicon replacement gate removal process, a native oxide punch-through process can be performed by a capacitively coupled plasma induced in the processing chamber to remove the native oxide layer on top of the silicon mandrels or silicon replacement gates. After the native oxide punch-through process, an inductively coupled plasma can be used for silicon mandrel or silicon replacement gate removal process. One example of such processing chamber is further described below.

Figure 8:
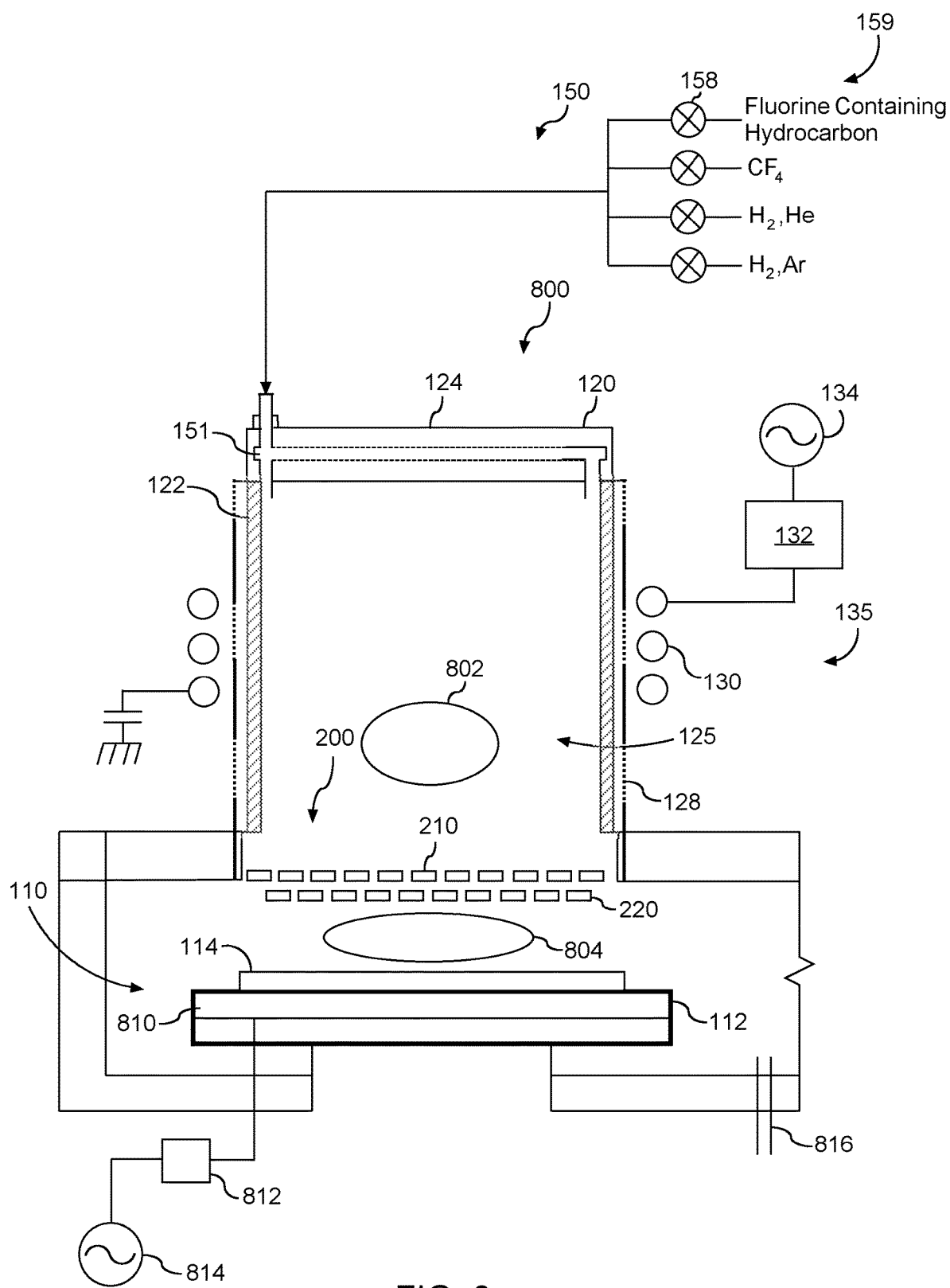
FIG. 8 depicts an example plasma processing apparatus according to example embodiments of the present disclosure.

FIG. 8 depicts an example plasma processing apparatus 800 that can be used to implement processes according to example embodiments of the present disclosure. The plasma processing apparatus 800 is similar to the plasma processing apparatus 100 of FIG. 3.

More particularly, plasma processing apparatus 800 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 8, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 800 of FIG. 8 is operable to generate a first plasma 802 (e.g., a remote plasma) in the plasma chamber 120 and a second plasma 804 (e.g., a direct plasma) in the processing chamber 110. The first plasma 802 can be generated by an inductively coupled plasma source. The second plasma 804 can be generated by, for instance, a capacitively coupled plasma source (e.g., bias). As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a pedestal operable to support the workpiece.

More particularly, the plasma processing apparatus 800 of FIG. 8 includes a bias source having bias electrode 810 in the pedestal 112. The bias electrode 810 can be coupled to an RF power generator 814 via a suitable matching network 812. When the bias electrode 810 is energized with RF energy, a second plasma 804 can be generated from a mixture in the processing chamber 110 for direct exposure to the workpiece 114. The processing chamber 110 can include a gas exhaust port 816 for evacuating a gas from the processing chamber 110.

As shown in FIG. 8, according to example aspects of the present disclosure, the apparatus 100 can include a gas delivery system 150 configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 8, the gas delivery system 150 can include feed gas line(s) for delivery of a $NF_3$ gas, feed gas line(s) for delivery of a $CF_4$ gas, feed gas line(s) for delivery of other fluorine containing hydrocarbons such as $CH_2F_2$, $CHF_3$, $CH_3F$, feed gas line(s) for delivery of a first hydrogen containing gas (e.g., $H_2$/He, or hydrogen gas mixed with other inert gas), and/or feed gas line(s) for delivery of a second hydrogen containing gas (e.g., $H_2$/Ar, hydrogen gas mixed with other inert gas). A control valve and/or mass flow controller 158 can be used to control a flow rate of each feed gas line to flow a process gas (e.g., $H_2$/He/$NF_3$, $H_2$/Ar/$NF_3$, $H_2$/He/$CF_4$, or $H_2$/Ar/$CF_4$) into the plasma chamber 120.

According to example aspects of the present disclosure, the workpiece 114 can include a silicon mandrel or silicon replacement gate at least partially covered by a native oxide layer. The workpiece 114 can be placed into the processing chamber 110 for silicon mandrel or silicon replacement gate removal process. Prior to silicon mandrel or silicon replacement gate removal process, a native oxide punch-through process can be performed by a capacitively coupled plasma 804 induced via the bias electrode 810 in the processing chamber 110 to remove the native oxide layer on top of the silicon mandrel or silicon replacement gate. After the native oxide punch-through process, an inductively coupled plasma 802 in the plasma chamber 120 can be used for etching the silicon mandrel or silicon replacement gate of the workpiece 114.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for removing a silicon structure disposed on a workpiece, the workpiece disposed in a second chamber that is separated from a first chamber by a separation grid, the separation grid comprising a first grid plate disposed adjacent to the first chamber, a second grid plate disposed between the first grid plate and the third grid plate, and a third grid plate disposed adjacent to the second chamber, wherein the first grid plate, the second grid plate, and the third grid plate spaced in parallel relationship to one another, the method comprising:

generating a capacitively coupled plasma using a capacitively coupled plasma source in a second chamber, wherein the capacitively coupled plasma is generated at a power of about 1 W up to about 150 W;

exposing the silicon structure of the workpiece to the capacitively coupled plasma to remove at least a portion of a native oxide layer on top of the silicon structure;

subsequent to exposing the silicon structure of the workpiece to the capacitively coupled plasma, generating species from a process gas using an inductive coupling element in the first chamber;

introducing a fluorine containing gas with the species to create a mixture, wherein the fluorine containing gas is introduced by a gas injection source disposed between the second grid plate and the third grid plate; and exposing the silicon structure of the workpiece to the mixture to remove at east a portion of the silicon structure.

2. The method of claim 1, wherein the silicon structure comprises a silicon mandrel or a silicon replacement gate.

3. The method of claim 1, wherein the process gas comprises hydrogen ($H_2$), helium (He), or argon (Ar).

4. The method of claim 1, wherein the fluorine containing gas comprises one or more of nitrogen trifluoride ($NF_3$), tetrafluoromethane ($CF_4$), fluoroform ($CHF_3$), difluoromethane ($CH_2F_2$), or fluoromethane ($CH_3F$).

5. The method of claim 1, wherein the fluorine containing gas is introduced as part of the process gas.

6. The method of claim 1, wherein the fluorine containing gas is injected via a post-plasma gas injection gas source, the gas injection source located outside of the first chamber and at a downstream flow location from the first chamber to the second chamber.

7. The method of claim 1, wherein the capacitively coupled plasma source is a bias electrode in the second chamber.

8. The method of claim 7, wherein the first chamber and the second chamber are part of a processing apparatus.

9. The method of claim 7, wherein the bias electrode is disposed underneath of the workpiece in the second chamber.

10. The method of claim 1, wherein the capacitively coupled plasma is generated at a power of from about 10 W to about 50 W.

* * * * *